(12) United States Patent
Reichenbach et al.

(10) Patent No.: US 11,800,695 B2
(45) Date of Patent: Oct. 24, 2023

(54) MEMORY INSERTION MACHINE

(71) Applicant: Google LLC, Mountain View, CA (US)

(72) Inventors: Joseph Reichenbach, Snoqualmie, WA (US); Toby Xu, Redmond, WA (US); Edward Gallagher, Bellevue, WA (US); John Zevenbergen, Woodway, WA (US)

(73) Assignee: Google LLC, Mountain View, CA (US)

( * ) Notice: Subject to any disclaimer, the term of this patent is extended or adjusted under 35 U.S.C. 154(b) by 564 days.

(21) Appl. No.: 16/684,069

(22) Filed: Nov. 14, 2019

(65) Prior Publication Data

US 2021/0153400 A1 May 20, 2021

(51) Int. Cl.
*H05K 13/04* (2006.01)
*G06K 15/02* (2006.01)

(52) U.S. Cl.
CPC ..... *H05K 13/0486* (2013.01); *G06K 15/1835* (2013.01); *H05K 13/04* (2013.01); *H05K 13/0406* (2018.08)

(58) Field of Classification Search
CPC .......... H05K 13/0486; H05K 13/0406; H05K 13/04; H05K 13/041; H05K 13/046; H05K 3/341; H05K 13/0482; G06K 15/1835

See application file for complete search history.

(56) References Cited

U.S. PATENT DOCUMENTS

| | | | |
|---|---|---|---|
| 4,510,683 A | 4/1985 | Fedde et al. | |
| 6,057,695 A | 5/2000 | Holt et al. | |
| 8,035,408 B1 | 10/2011 | Co | |
| 2003/0200653 A1 | 10/2003 | Ravert et al. | |
| 2012/0092036 A1 | 4/2012 | Lo | |
| 2015/0316513 A1* | 11/2015 | Grimard | ............ G01N 29/4427 702/103 |

FOREIGN PATENT DOCUMENTS

| | | | | |
|---|---|---|---|---|
| CA | 2891008 A1 * | 4/2012 | ............ | B25J 9/1687 |
| CN | 1561656 A | 1/2005 | | |
| CN | 101082635 A | 12/2007 | | |
| CN | 103037679 A | 4/2013 | | |

(Continued)

OTHER PUBLICATIONS

Machine translation of KR-20070002212 A (Year: 2007).*

(Continued)

*Primary Examiner* — Tarun Sinha
*Assistant Examiner* — James I Burris
(74) *Attorney, Agent, or Firm* — Lerner David LLP (57) ABSTRACT

The technology relates to a memory insertion machine for inserting memory modules into memory sockets on a circuit board. The memory insertion machine may include one or more insertion rods moveably mounted to one or more vertical guides, one or more profilometers, and an insertion controller. The insertion controller may be configured to apply an insertion force to a memory module in a memory socket, by controlling the movement of the one or more insertion rods on the one or more vertical guides. The insertion controller may be further configured to determine, based on information received from the one or more profilometers, a measured distance between a top of the memory module and a top of the memory socket.

17 Claims, 12 Drawing Sheets

(56) References Cited

FOREIGN PATENT DOCUMENTS

| CN | 203690681 U | * | 7/2014 | | |
|---|---|---|---|---|---|
| CN | 110027015 A | * | 7/2019 | | |
| CN | 110027015 A | | 7/2019 | | |
| EP | 1736302 A2 | * | 12/2006 | ............ | B29C 65/08 |
| GB | 2405465 A | | 3/2005 | | |
| JP | H01150829 A | | 6/1989 | | |
| KR | 20010080672 A | | 8/2001 | | |
| KR | 20070002212 A | * | 1/2007 | | |
| KR | 100722571 B1 | | 5/2007 | | |

OTHER PUBLICATIONS

Office Action for Chinese Patent Application No. 202011078750.2 dated Dec. 3, 2021. 9 pages.

Extended European Search Report for European Patent Application No. 20205913.5 dated Apr. 7, 2021. 12 pages.

Chyi-Yeu Lin, et al. "Image-Sensor-Based Fast Industrial-Robot Positioning System for Assembly Implementation." Sensors and Materials, vol. 29, No. 7 (2017) 935-945.

"ArtiMinds RPS—Memory Bar Insertion (UR + Vision Module).mp4—Universal Robots." 2018. Retrieved from the internet: < https://video.universal-robots.com/artiminds-rps-memory-bar-insertion-ur-vision>. pp. 1-5.

Office Action for European Patent Application No. 20205913.5 dated Jun. 28, 2023. 11 pages.

* cited by examiner

MEMORY INSERTION MACHINE

BACKGROUND

The proliferation of computing devices, such as web servers and workstations, has increased the demand for high speed memory. These computing devices require large amounts of high speed memory, such as DDR3 or DDR4, to operate at peak performance Given the limited capacity of each memory module, these computing devices typically rely on several memory modules such as 16, 24, 32, or more memory modules to provide the high speed memory they require to operate. The proper installation of these memory modules into the computing devices is essential to ensuring the computing devices have access to all of the high speed memory they require.

SUMMARY

One aspect of the disclosure provides a memory insertion machine. The memory insertion machine may include one or more insertion rods moveably mounted to one or more vertical guides, one or more profilometers, and an insertion controller. The insertion controller may be configured to apply, by controlling movement of the one or more insertion rods on the one or more vertical guides, an insertion force to a memory module in a memory socket and determine, based on information received from the one or more profilometers, a measured distance between a top of the memory module and a top of the memory socket.

In some instances, the memory insertion device may include one or more load cells, wherein the one or more load cells measure the insertion force applied to the memory module by the one or more insertion rods. In some examples, the insertion force includes individual insertion forces applied by each of the one or more insertion rods, and the individual insertion forces are each measured by different load cells of the one or more load cells. In some examples, the insertion controller is further configured to retract the one or more insertion rods when the insertion force applied by at least one the one or more insertion rods is greater than a threshold value. In some examples, the threshold value is 45.5 pound-force.

In some instances, the insertion controller is further configured to cease applying the insertion force by the one or more insertion rods when the measured distance matches a target distance.

In some instances, the memory insertion machine includes a horizontal guide, and a pair of guides, wherein a first end of the horizontal guide is connected to one of the pair of guides and a second, opposite end of the horizontal guide is connected to a second of the pair of guides, wherein the one or more vertical guides are connected to the horizontal guide. In some examples, a first motor configured to move the horizontal guide along a pair of guide tracks on the pair of guides, and a second motor configured to move the one or more vertical guides along a guide track in the horizontal guide. In some examples, the insertion controller is further configured to control positions of the horizontal guide and the one or more vertical guides by controlling the first motor and the second motor, respectively.

In some instances, the memory insertion machine includes a pair of motors configured to move the one or more insertion rods along guide tracks in the vertical guides, wherein the insertion controller is further configured to control positions of the one or more insertion rods by controlling the pair of motors.

In some instances, the memory insertion machine includes an input device configured to receive a selection of a circuit board model, wherein the circuit board model is associated with position data indicating locations of a plurality of memory sockets on a circuit board. In some examples, the insertion controller is configured to move the insertion wherein the insertion controller is further configured to position the one or more insertion rods above the plurality of memory sockets in a predefined pattern, based on the position data. In some examples, for each time the one or more insertion rods are positioned above a memory socket of the plurality of memory sockets, the insertion controller causes the one or more insertion rods to apply a force to a memory module positioned in the respective memory socket until the measured distance between the top of the respective memory socket and the top of the memory module matches a target distance.

In some instances, the insertion controller is further configured to control an insertion speed of the memory module by controlling the insertion force applied by the one or more insertion rods. In some examples, the insertion speed is adjusted based on the insertion force applied by the one or more insertion rods.

In some instances, the one or more insertion rods include two insertion rods, the two insertion rods positioned to push the memory module into the memory socket from opposite sides.

Another aspect of the disclosure provides a method for inserting one or more memory modules into one or more memory sockets. The method includes applying, by one or more insertion rods, an insertion force to a memory module in a memory socket, measuring, by one or more profilometers, a distance between a top of the memory module and a top of the memory socket, and controlling, by an insertion controller, the insertion force applied to the memory module by the one or more insertion rods based on the measured distance, the insertion controller configured to cease applying the insertion force by the one or more insertion rods when the measured distance matches a target distance.

In some instances, the method further includes measuring, by one or more load cells, the applied force to the memory module by the one or more insertion rods. In some examples, each of the one or more load cells measures the insertion force applied by one of the one or more insertion rods, such that the insertion force applied by each of the one or more insertion rods is measured by one of the one or more load cells. In some examples, the method further includes retracting, by the insertion controller, the one or more insertion rods when the insertion force applied by one or more of the one or more insertion rods is greater than a threshold value.

DETAILED DESCRIPTION

Figure 1A:
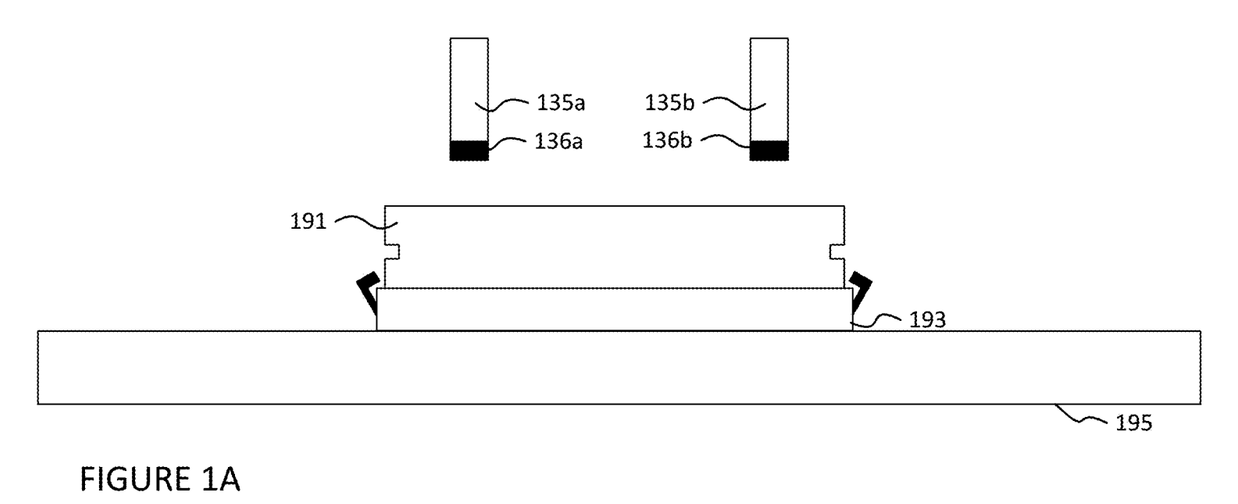
FIGS. 1A and 1B show a side view of insertion rods pushing a memory module into a memory socket mounted to a circuit board, in accordance with aspects of the disclosure.
Figure 1B:
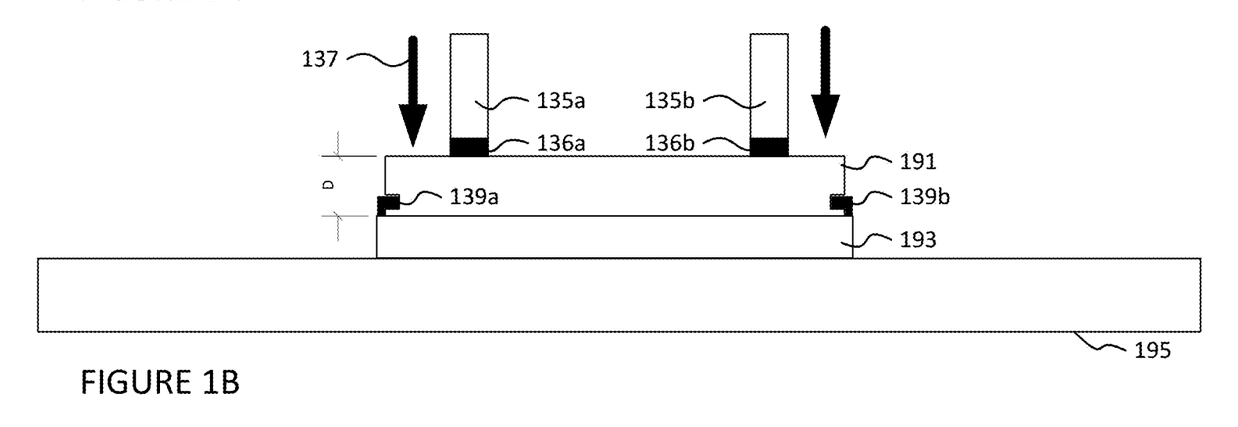

The technology relates generally to a device for inserting memory modules, such as Dual Inline Memory Modules (DIMM), into memory sockets. For example, and as illustrated in FIGS. 1A and 1B, the memory insertion machine may include insertion rods 135a and 135b for pushing a memory module 191 into a memory socket 193 mounted to a circuit board 195, such as a motherboard. The insertion rods 135a, 135b may push the memory module 191 into the memory socket 193 in the direction illustrated by the arrow 137 in FIG. 1b. The downward force applied by the insertion rods 135a, 135b may cause locking clips 139a and 139b to rotate towards, and secure the memory module 191 into the memory socket 193 when the memory module is fully inserted into the memory socket.

Measurements may be used to monitor the depth of insertion of the memory module 191 relative to the memory socket 193 as the insertion rods of the insertion system push the memory module 191 into the memory socket 193. In this regard, the insertion rods may continue to push the memory module into the memory socket until the relative distance from the top of the memory socket is a predetermined target distance 'D' from the top of the memory module 191. By inserting the memory module the target distance 'D', confidence that the memory module is properly seated in the memory socket, and therefore installed correctly, may be increased.

Manually installing memory modules may be labor intensive. In enterprise and manufacturing environments, hundreds, thousands, tens of thousands, or more memory modules may be installed. Systems which automate the installation process may decrease the installation time of memory modules, but both manual and automated installation may be prone to errors. These errors may include the use of too much force during insertion of a memory module into a memory socket, which may lead to broken components such as broken circuit boards, memory modules, and memory sockets. Moreover, improper installation of a memory module may lead to system failures or sub-par operation of the system. For example, memory modules which are not seated properly in a memory socket may cause the system to short-circuit. In some instances, improperly seated memory modules, that would otherwise be operational if seated properly, may be unavailable for use by the system. Additionally, troubleshooting improperly installed memory modules in systems that have a large number of memory modules may take a significant amount of time.

Figure 2A:
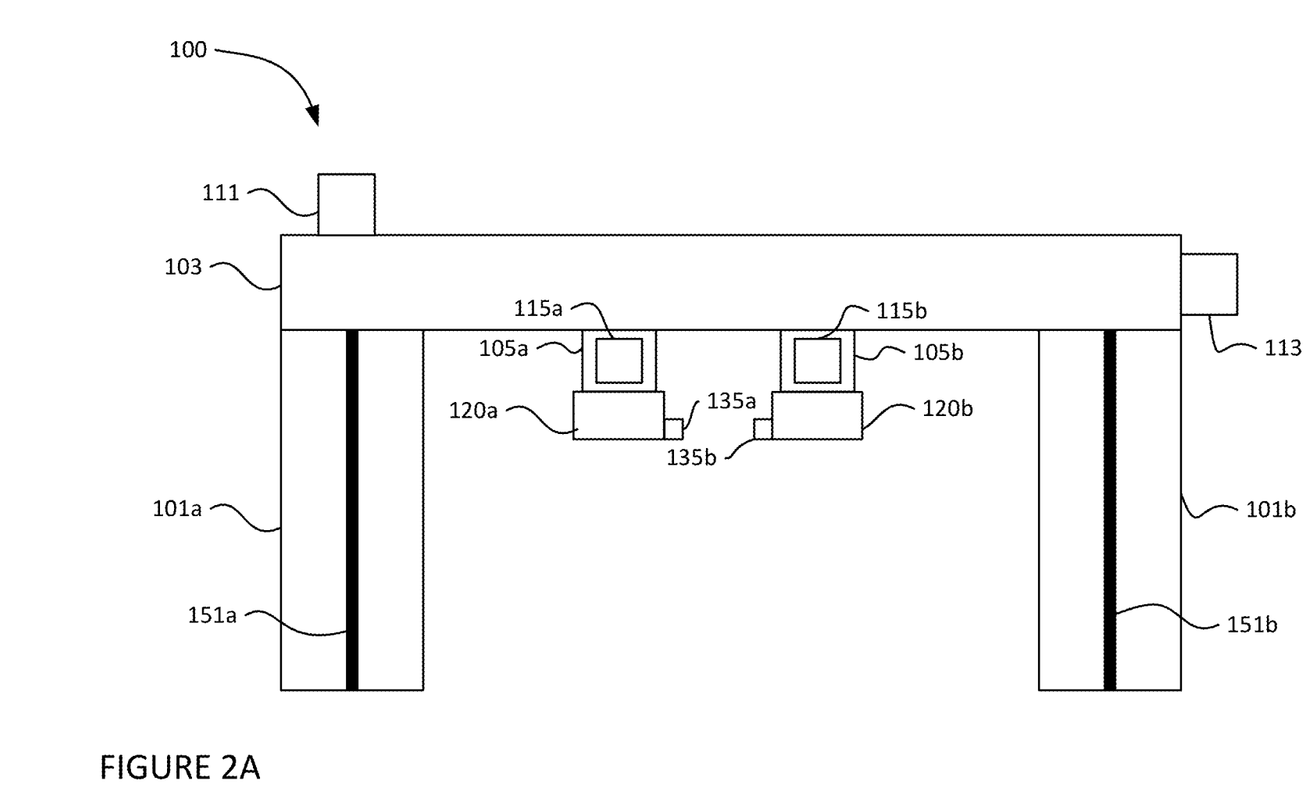
FIG. 2A shows a top-down view of the memory insertion machine in accordance with aspects of the disclosure.

FIG. 2A shows a top-down view of the memory insertion machine 100. The memory insertion machine 100 includes insertion rods 135a, 135b and profilometers 120a, 120b. The insertion rods 135a, 135b and profilometers 120a, 120b are mounted or otherwise attached to vertical guides 105a, 105b. Vertical guides 105a, 105b may be mounted or otherwise attached to horizontal guide 103, which in turn is mounted to a pair of guides 101a and 101b.

The guides, including the vertical guides 105a, 105b, the horizontal guide 103, and the pair of guides 101a, 101b may include guide slots, tracks, or other such guiding elements for positioning other guides, insertion rods, or profilometers. For instance, and as shown in FIG. 2A, each guide in the pair of guides 101a, 101b may include guide tracks 151a, 151b, respectively, in which opposing ends of the horizontal guide 103 may be moveably attached. In this regard, each of the opposing ends of the horizontal guide 103 may include a carriage or other such device that connects to guide tracks in the pair of guides 101a, 101b. Although the guide tracks 151a, 151b are shown as being on the top surface of each guide in the pair of guides, the guide tracks may be on any surface of the pair of guides, such as the sides or bottom.

Figure 2B:
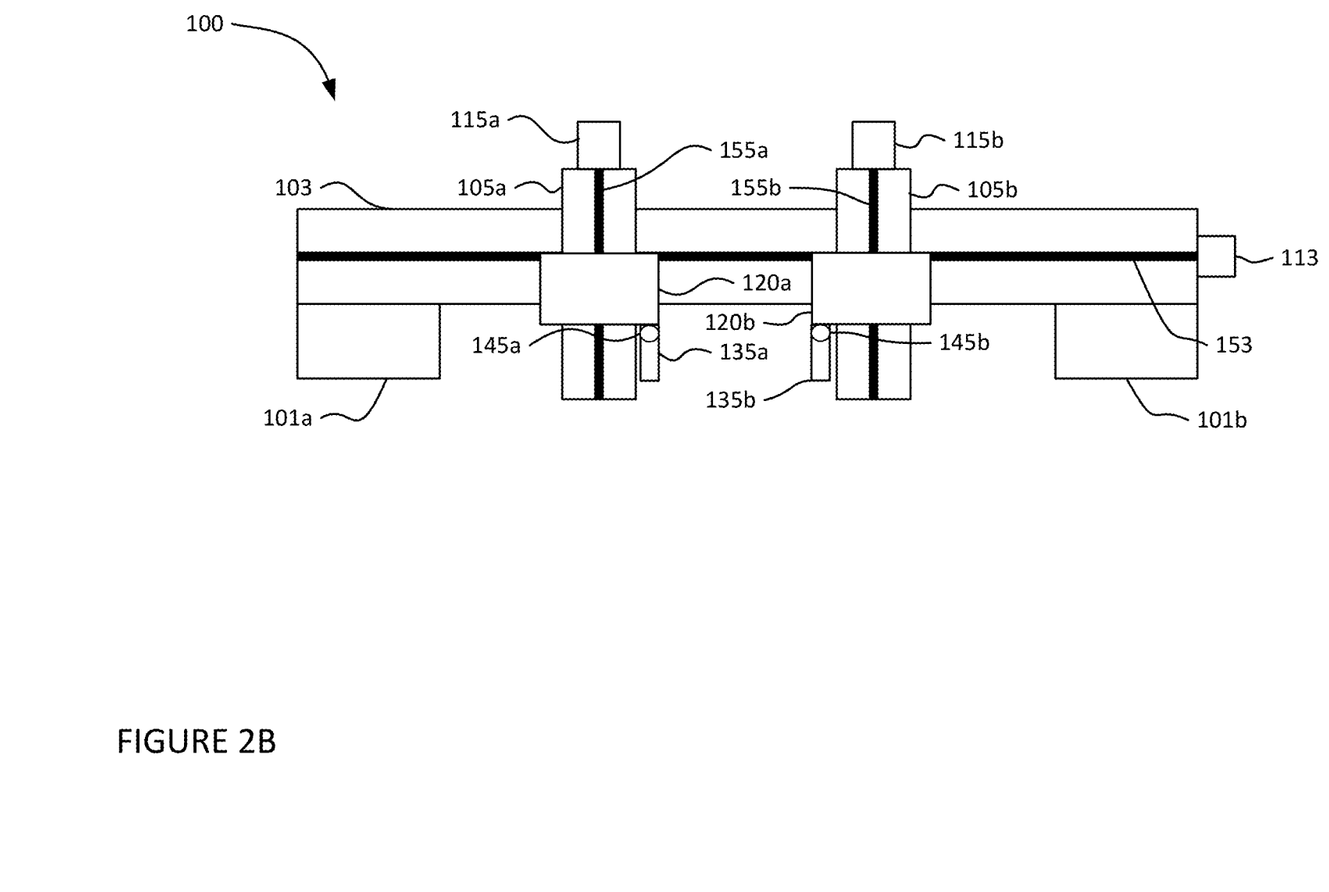
FIG. 2B shows a side view of the memory insertion machine in accordance with aspects of the disclosure.

FIG. 2B shows a front view of the memory insertion machine 100, including a guide track 153 on the horizontal guide 103 and guide tracks 155a and 155b on the vertical guides 105a and 105b, respectively. The vertical guides 105a and 105b may be movably connected to the guide track 153 on the horizontal guide 103. Profilometers 120a and 120b may each be moveably connected to a guide track of the vertical guides 105a and 105b, respectively. Although FIGS. 2A and 2B illustrate the insertion rods 135a, 135b being connected to the profilometers 120a, 120b, the insertion rods may be directly connected to guide tracks of the vertical guides or connected to the guide tracks of the vertical guides through intermediary connectors or other such devices.

Movement of the guides, insertion rods, and profilometers may be implemented by drive units, such as servo motors, actuators including screw and belt driven actuators, or other such devices capable of controlling movements. For example, a first motor 111 may control movement of the horizontal guide 103 along the guide tracks 151a, 151b of the pair of guides, as shown in FIG. 2A. A second motor 113 may control movement of the vertical guides 105a, 105b along the guide track 153 of the horizontal guide. Movement of the insertion rods 135a, 135b and profilometers 120a, 120b on the guide tracks 155a, 155b of the vertical guides 105a, 105b, respectively, may be controlled by additional motors 115a, 115b, as shown in FIG. 2B.

Figure 3A:
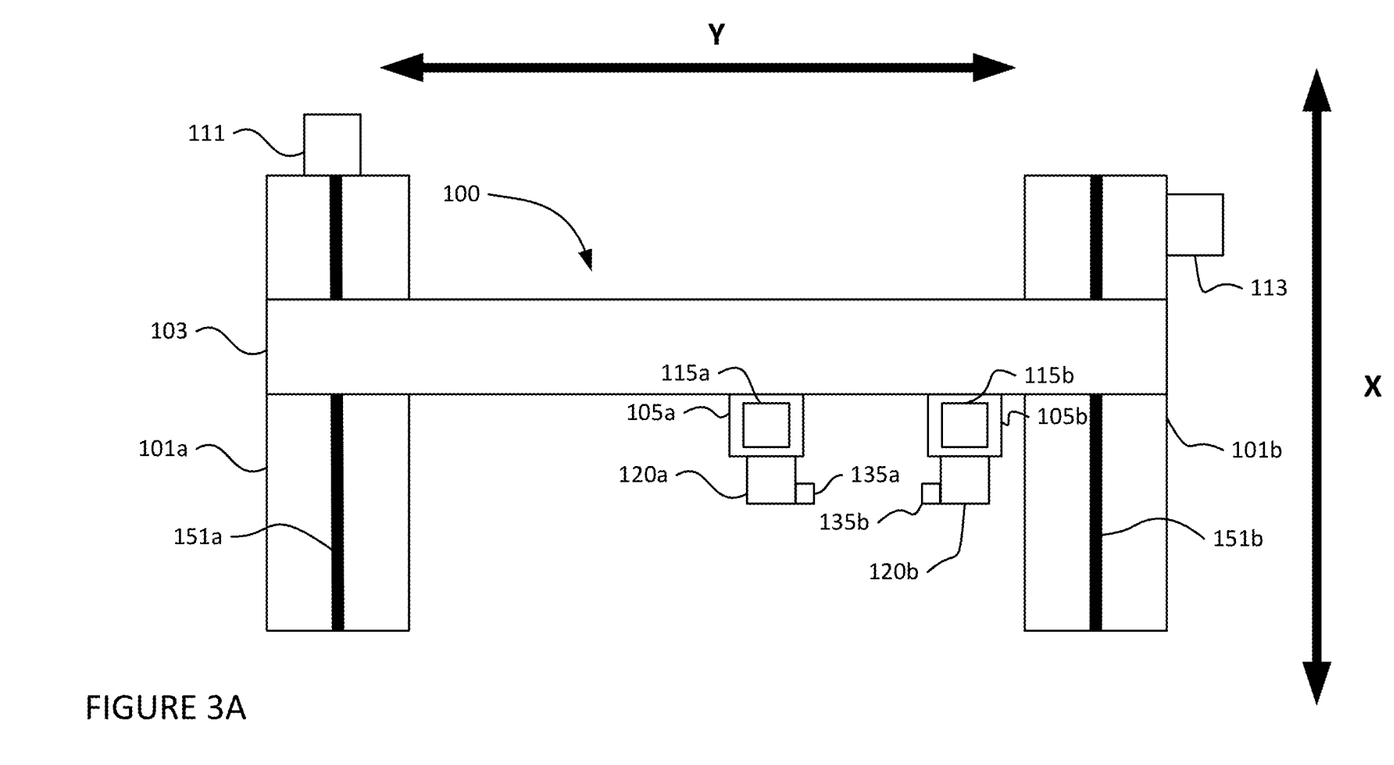
FIG. 3A shows a top-down view of movements of the memory insertion machine in accordance with aspects of the disclosure.
Figure 3B:
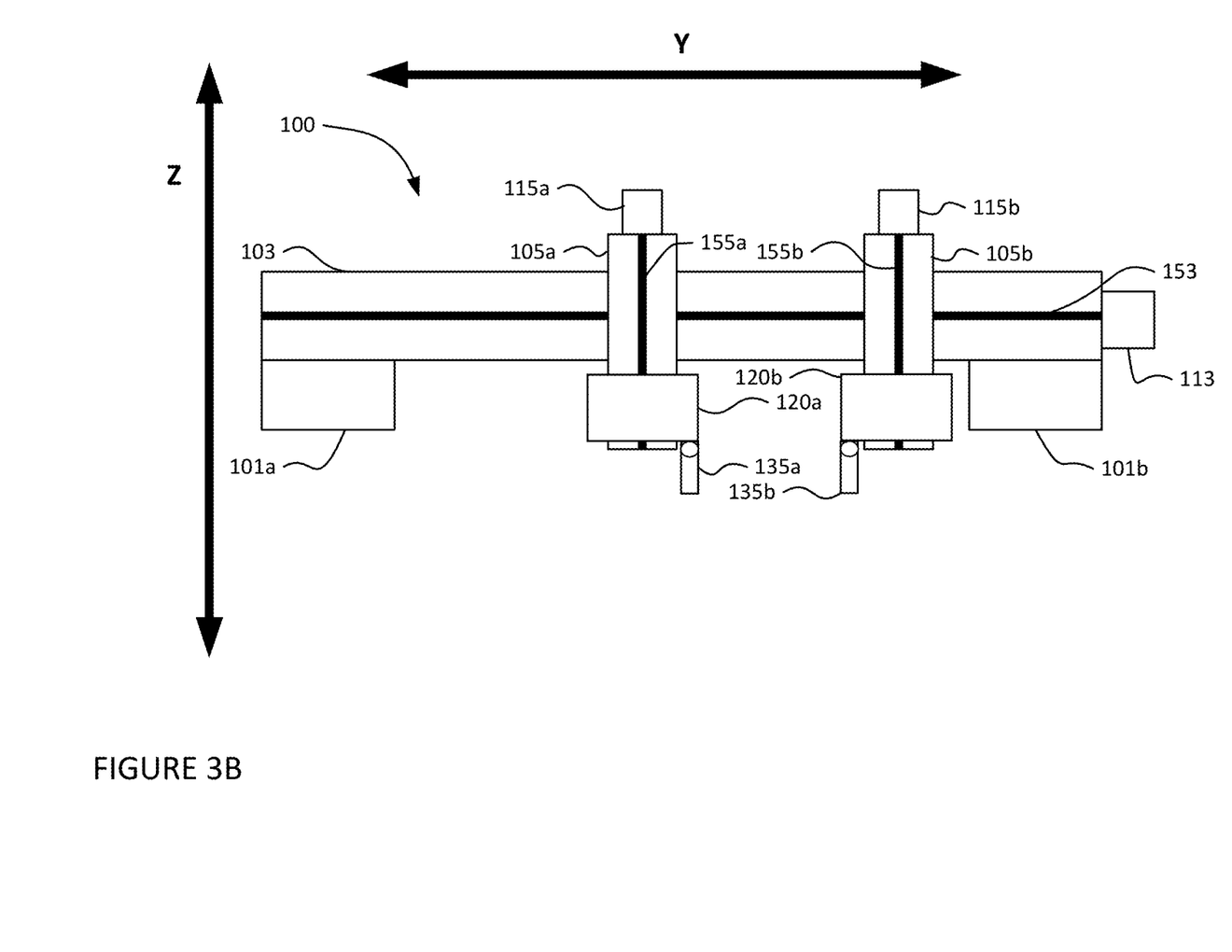
FIG. 3B shows a side view of movements of the memory insertion machine in accordance with aspects of the disclosure.

Example movements of the guides, insertion rods, and profilometers, relative to the positions shown in FIGS. 2A and 2B, are shown in FIGS. 3A and 3B, respectively. Turning to FIG. 3A, the first motor 111 may move the horizontal guide 103 along the guides tracks 151a, 151b of the pair of guides 101a, 101b in the X direction.

As shown in FIG. 3B, the second motor 113 may move the vertical guides 105a, 105b along the guide track 153 of the horizontal guide 103 in the Y direction. Additional motors 115a, 115b may move the profilometers 120a, 120b and insertion rods 135a, 135b along the guide tracks 155a, 155b of the vertical guides 105a, 105b along the Z direction. Although both the profilometers 120a, 120b and insertion rods 135a, 135b are shown moving along the Z direction in FIG. 3B, the profilometers may remain stationary along the Z direction. In this regard, the position of the profilometers may be not be controlled by the additional motors 115a, 115b.

The insertion rods 135a, 135b may be made of a metal, such as steel, aluminum, etc., or some other material such as plastic, wood, etc. The shape of the insertion rods may be round, square, rectangular, or any other shape. The tips of the insertion rods that contact the memory modules may include a relatively soft material to minimize the risk of damage to the memory module. For instance, and as shown in FIGS. 1A and 1B, the tips of insertion rods 135a and 135b are coated in a rubber material 136a and 136b, respectively.

The insertion rods 135a, 135b may be configured to push a memory module 191 from opposite sides into a memory socket 193, as shown in FIG. 1B. In this regard, the insertion rods 135a, 135b may be configured to push down on opposite sides of the memory module 191 with relatively even force so that the memory module remains in alignment with the memory socket 193 during insertion. Although two insertion rods are shown, one insertion rod, three insertion rods, or more may be included on the memory insertion machine.

Figure 4:
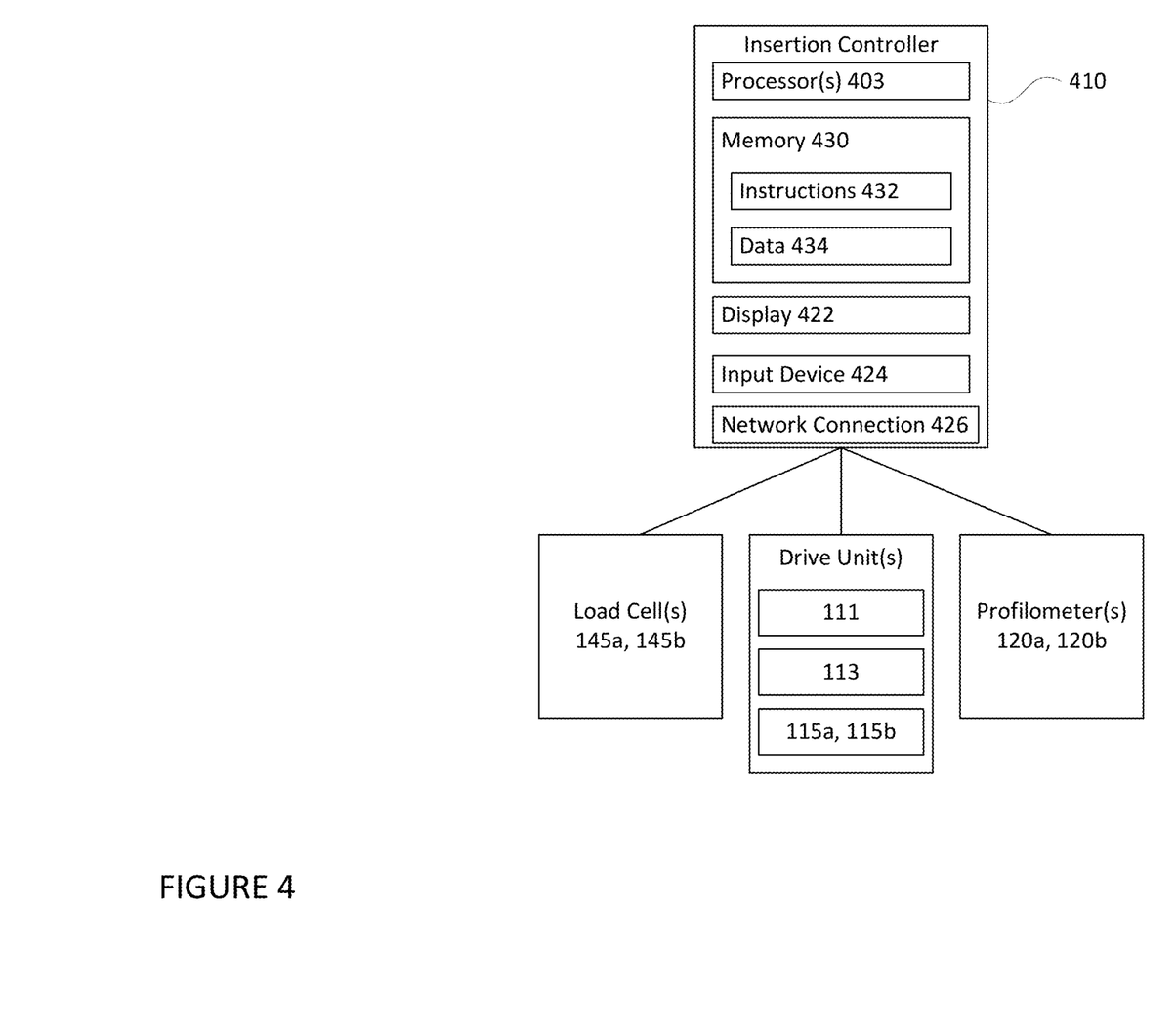
FIG. 4 shows a block diagram of an insertion controller in accordance with aspects of the disclosure.

The operation of the memory insertion system 100 may be controlled by an insertion controller 410, shown in FIG. 4. The insertion controller 410 may include a processor 403 and memory 430. The processor may be any conventional processor, such as processors from Intel Corporation or Advanced Micro Devices. Alternatively, the processor may be a dedicated controller such as an application specific integrated circuit (ASIC), field programmable gate array (FPGA), etc. Additionally, the processor 403 may include multiple processors, multi-core processors, or a combination thereof. Although only one processor 403 is shown in FIG. 4, one of ordinary skill in the art would recognize that several processors may exist within insertion controller 410. Accordingly, references to a processor will be understood to include references to a collection of processors or dedicated logic that may or may not operate in parallel.

The memory 430 stores information accessible by the one or more processors 403, including instructions 432 and data 434 that may be executed or otherwise used by the processor 403. The memory 430 may be of any type capable of storing information accessible by the processor, including a computing device-readable medium, or other medium that stores data that may be read with the aid of an electronic device, such as a hard-drive, memory card, ROM, RAM, DVD or other optical disks, as well as other write-capable and read-only memories. Systems and methods may include different combinations of the foregoing, whereby different portions of the instructions and data are stored on different types of media.

The instructions 432 may be any set of instructions to be executed directly (such as machine code) or indirectly (such as scripts) by the processor. For example, the instructions may be stored as computing device code on the computing device-readable medium. In that regard, the terms "instructions" and "programs" may be used interchangeably herein. The instructions may be stored in object code format for direct processing by the processor, or in any other computing device language including scripts or collections of independent source code modules that are interpreted on demand or compiled in advance. Functions, methods and routines of the instructions are explained in more detail below.

The data 434 may be retrieved, stored or modified by processor 403 in accordance with the instructions 432. For instance, although the claimed subject matter is not limited by any particular data structure, the data may be stored in computing device registers, in a relational database as a table having a plurality of different fields and records, XML documents or flat files. The data may also be formatted in any computing device-readable format.

The insertion controller 410 may include all of the components normally used in connection with a computing device such as the processor and memory described above as well as an input device (e.g., a mouse, keyboard, touch screen, buttons, and/or microphone) and various electronic displays (e.g., a monitor having a screen or any other electrical device that is operable to display information). In this example, the insertion controller includes a display 422 as well as input device 424. In some instances, the display may be a touch screen display capable of operating as a user input. The input device 424 and/or display 422 may be used to receive a selection of a circuit board model into which memory modules are to be inserted by the memory insertion machine 100, as described herein.

The insertion controller 410 may also include one or more network connections 426 to facilitate communication with other computing and storage devices. The network connections 426 may include wired or wireless communication protocols such as Bluetooth, Bluetooth low energy (LE), cellular connections, as well as various configurations and protocols including the Internet, World Wide Web, intranets, virtual private networks, wide area networks, local networks, private networks using communication protocols proprietary to one or more companies, Ethernet, Wi-Fi and HTTP, and various combinations of the foregoing.

The insertion controller 410 may store in memory 430 position data of one or more circuit board models. The position data for each circuit board model may include the locations of memory sockets relative to a known location. For instance, the memory insertion machine 100 may have a known location where circuit boards are positioned relative to an initial starting position of the memory insertion machine 100. In some instances, the position data may be retrieved by the insertion controller 410 from another storage device, such as a networked attached storage device.

Figure 5:
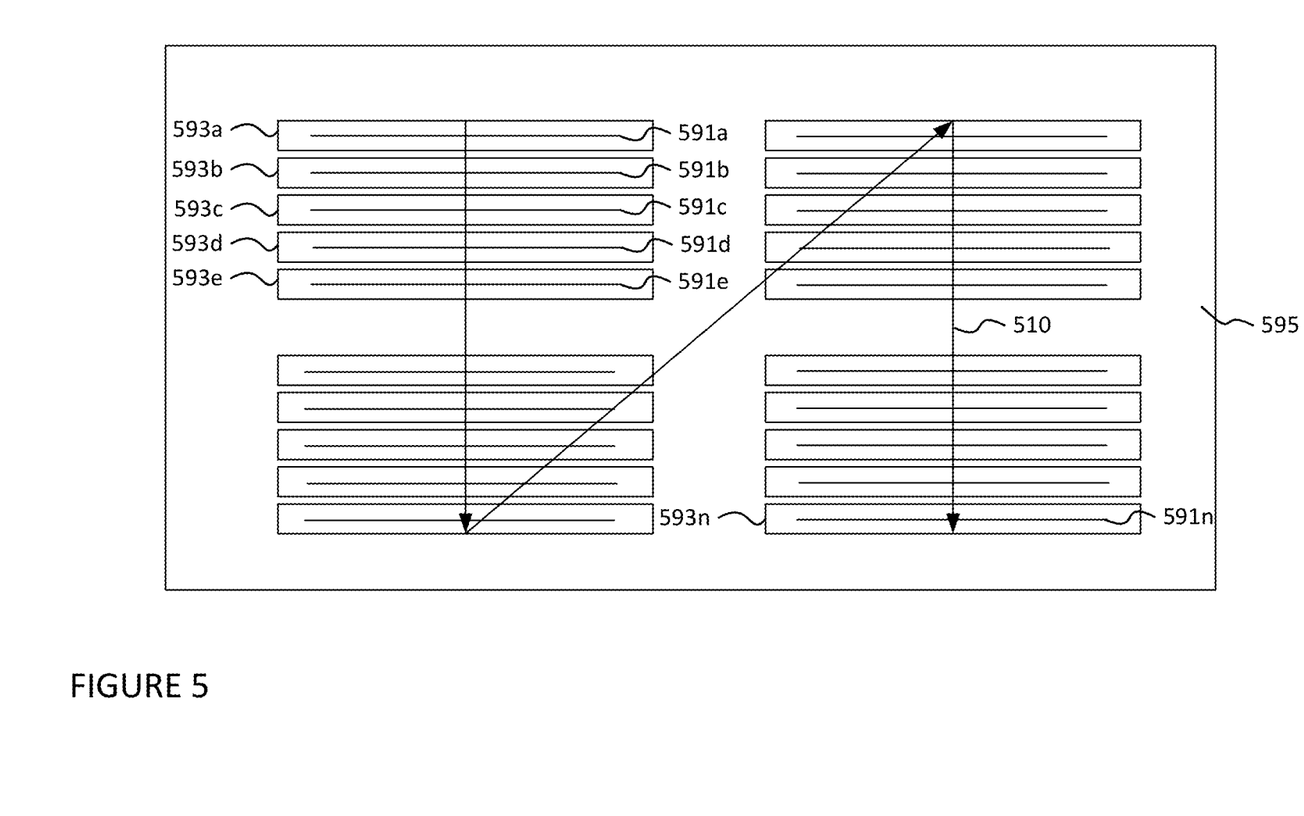
FIG. 5 illustrates an insertion pattern in accordance with aspects of the disclosure.

The insertion controller 410 may be configured to communicate with the drive units, such as motors 111, 113, 115a, and 115b to control the positioning of the guides, insertion rods, and profilometers relative to memory sockets on a circuit board. In this regard, based on the position data and known location, the insertion controller 410 may communicate with the drive units to position the insertion rods relative to the memory sockets on a circuit board and have the insertion rods push a memory module into the memory socket. This process may be repeated until memory modules are inserted into all memory sockets on the circuit board model. For example, on a circuit board 595 having 20 memory sockets 593a-593n, as shown in FIG. 5, the insertion controller 410 may control the memory insertion machine 100 such that it positions the insertion rods above memory modules 591a-591n positioned in memory sockets 593a-593n, respectively, in a programmed pattern 510. The pattern may be stored in association with the position data corresponding to the circuit board 595. According to pattern 510, the insertion controller 410 may control the drive units 111, 113, 115a, and 115b such that the insertion rods 135a, 135b of memory insertion machine 100 are positioned above memory socket 593a. When the insertion rods 135a, 135b are positioned above the memory socket 593a, the insertion rods 135a, 135b may push the memory module 591a into memory socket 593a. After memory module 591a is inserted, the insertion controller 410 may move the memory insertion machine 100 to a position relative to memory socket 593b. Memory module 591b may then be inserted into memory socket 593b. The memory insertion machine 100 may be moved according to pattern 510 until all memory modules are inserted into their respective memory sockets.

Referring again to FIG. 4, the insertion controller 410 may be configured to communicate with load cells 145a, 145b that measure the force applied by each insertion rod 135a, 135b. In this regard, a load cell may be mounted on or in the vicinity of an insertion rod. As the insertion rods 135a, 135b push a memory module into a memory socket, each load cell 145a, 145b may detect the force being applied by a respective insertion rod and forward the information to the insertion controller. For example, and as shown in FIG. 2B load cell 145a may monitor the force being applied by insertion rod 135a and load cell 145b may monitor the force being applied by insertion rod 135b.

The forces measured by the load cells may be provided to insertion controller 410. In the event the force measured by one or more of the load cells is greater than a threshold value, such as 35 pound-force, the insertion controller 410 may direct the drive units, such as motors 111, 113, 115a, and 115b, to cease movement of the insertion rods 135a, 135b and therefore prevent increases in forces applied to the memory module. By doing such, the risk of damage to the memory module, memory socket, and/or circuit board may be reduced. In some instances, the insertion controller 410 may cause the drive units to retract the insertion rods 135a, 135b away from the memory modules. Although only two load cells are shown in FIG. 2B, there may be any number of load cells. For instance, each insertion rod may have two or more load cells monitoring its insertion force. In examples where more than two insertion rods are present, there may be one or more load cells for each additional insertion rod.

The profilometers 120a, 120b may provide distance measurements between a memory module and a memory socket to the insertion controller 410. In this regard, the profilometers 120a, 120b may be positioned such that they can capture distance measurements for the memory module and the memory socket on opposite sides. For example, and as shown in the side view of memory socket 193 and circuit board 195 in FIG. 6A, profilometers 120a and 120b are positioned on opposite sides of memory module 191. By positioning the profilometers 120a, 120b on opposite sides of the memory module 191, the insertion distance of the memory module 191 into the memory socket 193 of circuit board 195 caused by each of the insertion rods may be monitored by the insertion controller 410. Although only two profilometers 120a and 120b are shown, the memory insertion machine 100 may include any number of profilometers.

Figure 6A:
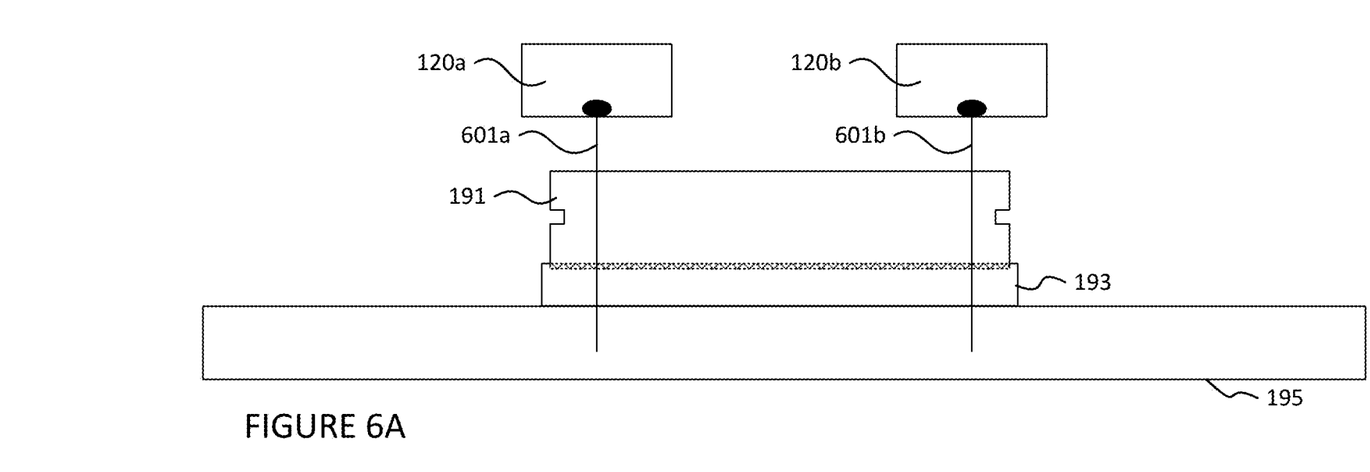
FIG. 6A shows a side view of profilometer beam plane in accordance with aspects of the disclosure.
Figure 6B:
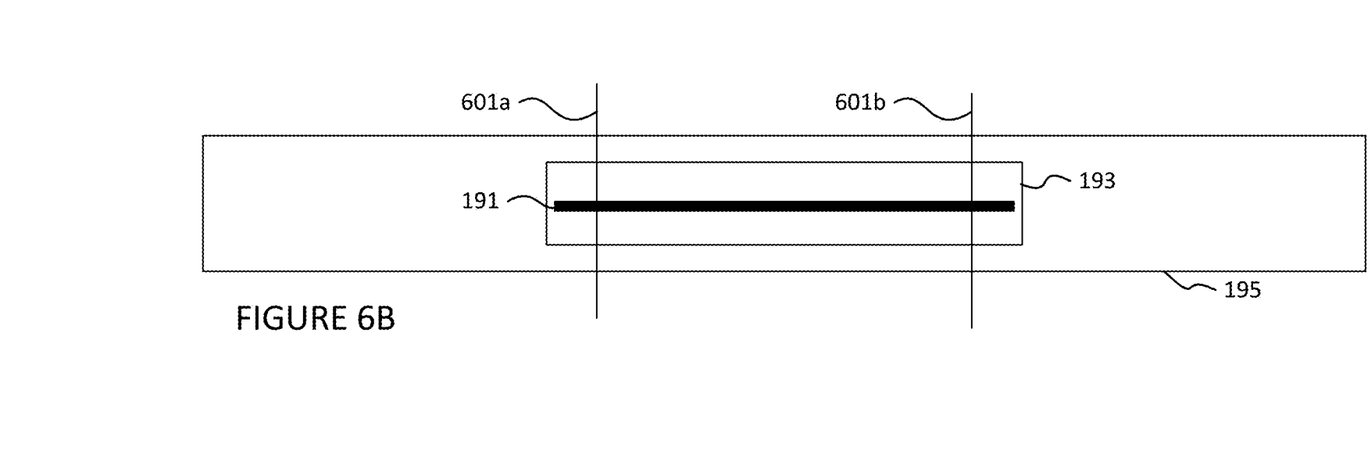
FIG. 6B shows a top-down view of profilometer beam plane in accordance with aspects of the disclosure.
Figure 7:
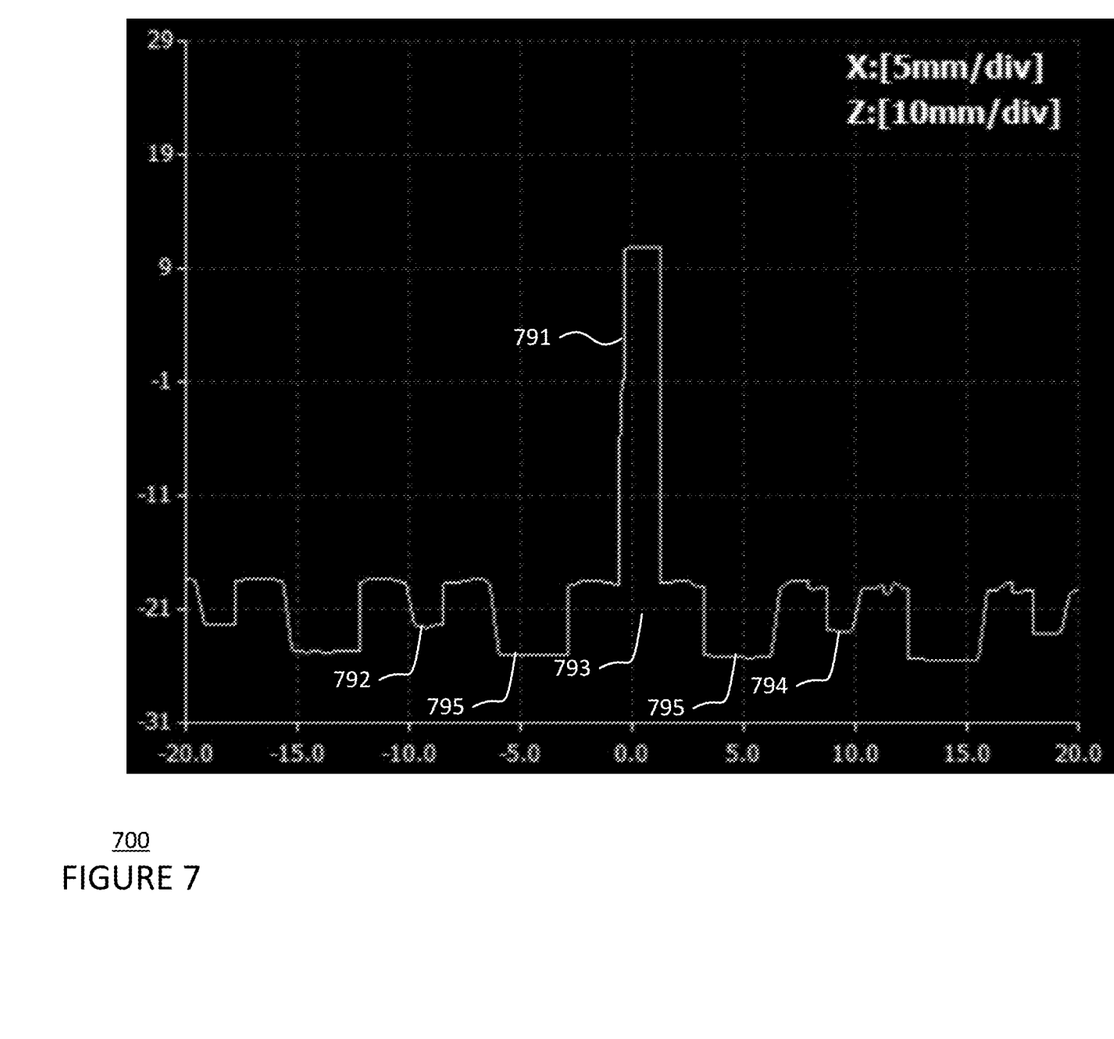
FIG. 7 is an illustration of profilometer distance measurements in accordance with aspects of the disclosure.

Each profilometer may transmit and receive a beam plane 601a and 601b, as shown in FIGS. 6A and 6B. As shown in the top-down view of the memory socket 193 and circuit board 195 of FIG. 6B, the beam plane may capture data across the entirety of memory socket 193 on both sides of memory module 191. In some instances, the beam plane may capture data across multiple memory sockets at a time. For instance, FIG. 7 shows a visualization 700 of data captured by a profilometer across three memory sockets 792, 793, and 794 positioned on circuit board 795. A single memory module 791 is positioned in memory socket 793.

In some instances, the position of the profilometers may be dependent upon the circuit board model. In this regard, the profilometers may be prone to laser scatter due to reflective components on a circuit board, memory sockets, and memory modules. The location of such reflective components may be different for each circuit board model, as the position of components on each circuit board may be different. Additionally, the memory socket types, and memory module modules to be installed into the memory sockets, may be different between each circuit board model. To minimize laser scatter, positions of the profilometers 120a, 120b that have a low probability of suffering from laser scatter may be determined and stored in the memory 430 of insertion controller 410, or other storage device, in association with the positioning data of each circuit board model. In some embodiments, the positioning of the profilometers 120a, 120b on the Z direction, shown in FIG. 2B, may be increased or decreased independently of the insertion rods 135a, 135b to further minimize the risk of laser scatter. Stated another way, the profilometers may move independently of the insertion rods.

Figure 8:
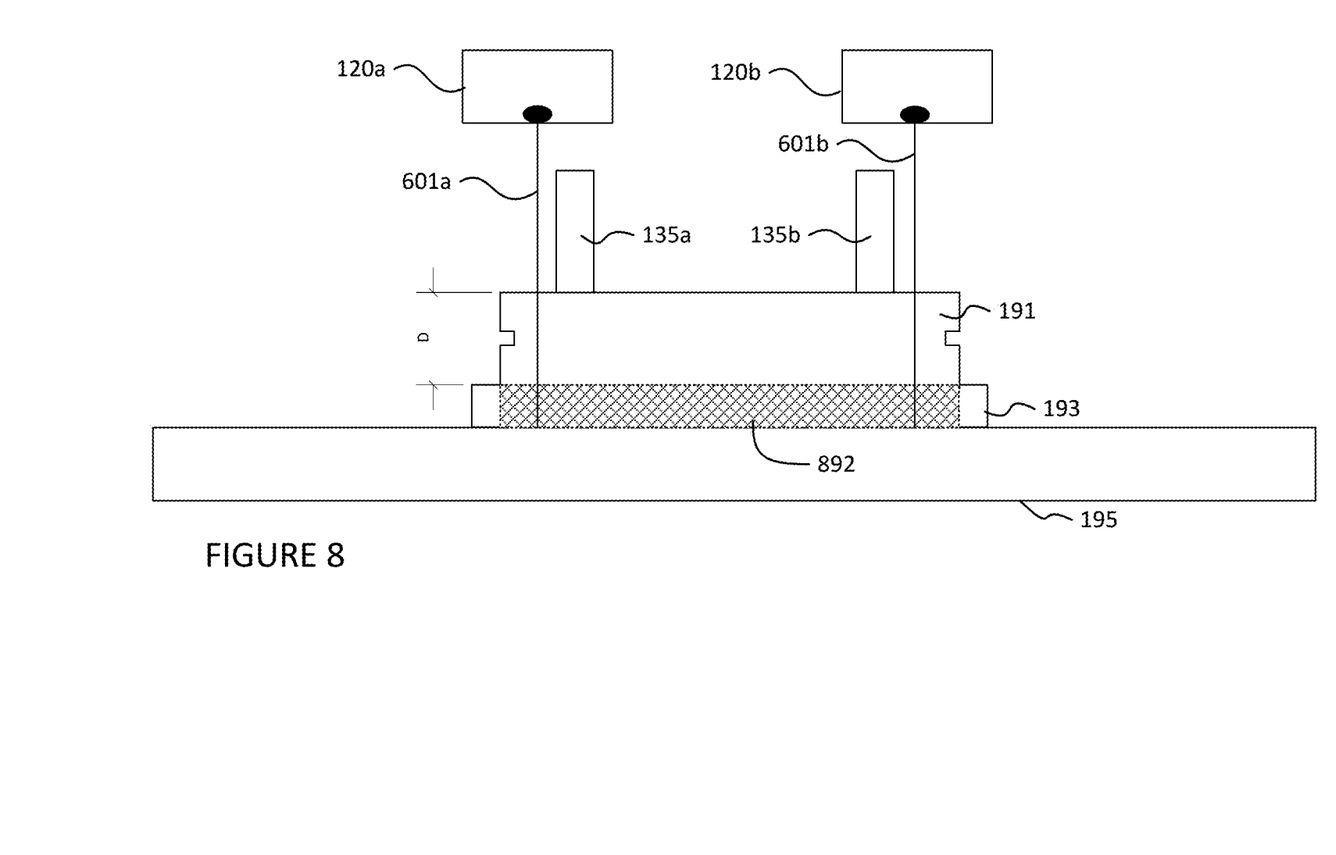
FIG. 8 is an illustration of a target distance measurement in accordance with aspects of the disclosure.

During insertion of a memory module into a memory socket, the insertion controller 410, using the distance measurements from the profilometers 120a, 120b, may measure the distance of the top of the memory module to the top of the memory socket. A target distance at which insertion of the memory module into the memory socket is completed may be stored in association with the positioning data of each circuit board model. The target distance may correspond to a distance that is known to result in proper seating and installation of the memory module in the memory socket. For example, FIG. 8 shows memory module 191 being inserted into memory socket 193 of circuit board 195 by insertion rods 135a and 135b. As the insertion rods 135a and 135b insert the memory module 191 into the memory socket 193, distance measurements provided by the beam planes 601a and 601b of profilometers 120a and 120b, respectively, may be provided to insertion controller 410. Once the insertion controller 410 detects the distance from the top of the memory socket 193 and the top of the memory module 191 is equal to the target distance 'D', the insertion of the memory module 191 may be completed and the insertion controller 410 may cause insertion rods 135a and 135 to stop applying further force to memory module 191. The portion of the memory module 191 inside of the memory socket 193 is shown by shaded portion 892.

By using the distance between the top of the memory socket and the top of the memory module, the risk of faulty installation of the memory module is reduced as the relative distance between the top of the memory socket and top of the memory module are dependent upon the distance of insertion of the memory module into the memory socket. Other measurements, such as the distance from the top of the memory module to the circuit board may be prone to false reading due to flexing of the circuit board during installation. Absolute readings, such as from the profilometer to the top of the memory module may also be prone to false readings due to flex of the circuit board, memory module, and/or memory socket during installation.

In addition to the operations described above and illustrated in the figures, various operations will now be described. The following operations do not have to be performed in the precise order described below. Rather, various steps can be handled in a different order or simultaneously, and steps may also be added or omitted.

Figure 9:
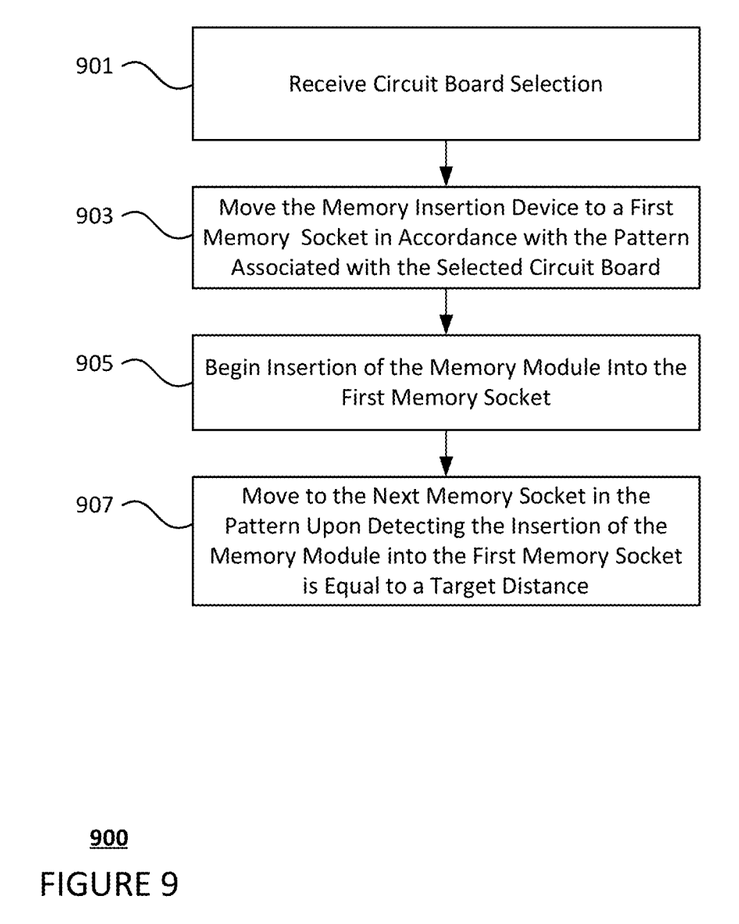
FIG. 9 is a flow chart in accordance with one aspect of the disclosure.

FIG. 9 illustrates a flow chart 900 showing an example memory insertion operation of the memory insertion machine 100. As shown in block 901, the memory insertion machine 100 may receive a selection of a circuit board model via an input or command, such as a selection on input device 424. Based on the selection, the insertion controller may control the memory insertion machine 100 such that it pushes each memory module into a memory socket. In this regard, the insertion controller 410 may control the various drive units, including motors 111, 113, 115a, and 115b, such that they move the memory insertion machine in accordance with a pattern corresponding to the selected circuit board model, starting with a first memory socket as shown in block 903.

Figure 10:
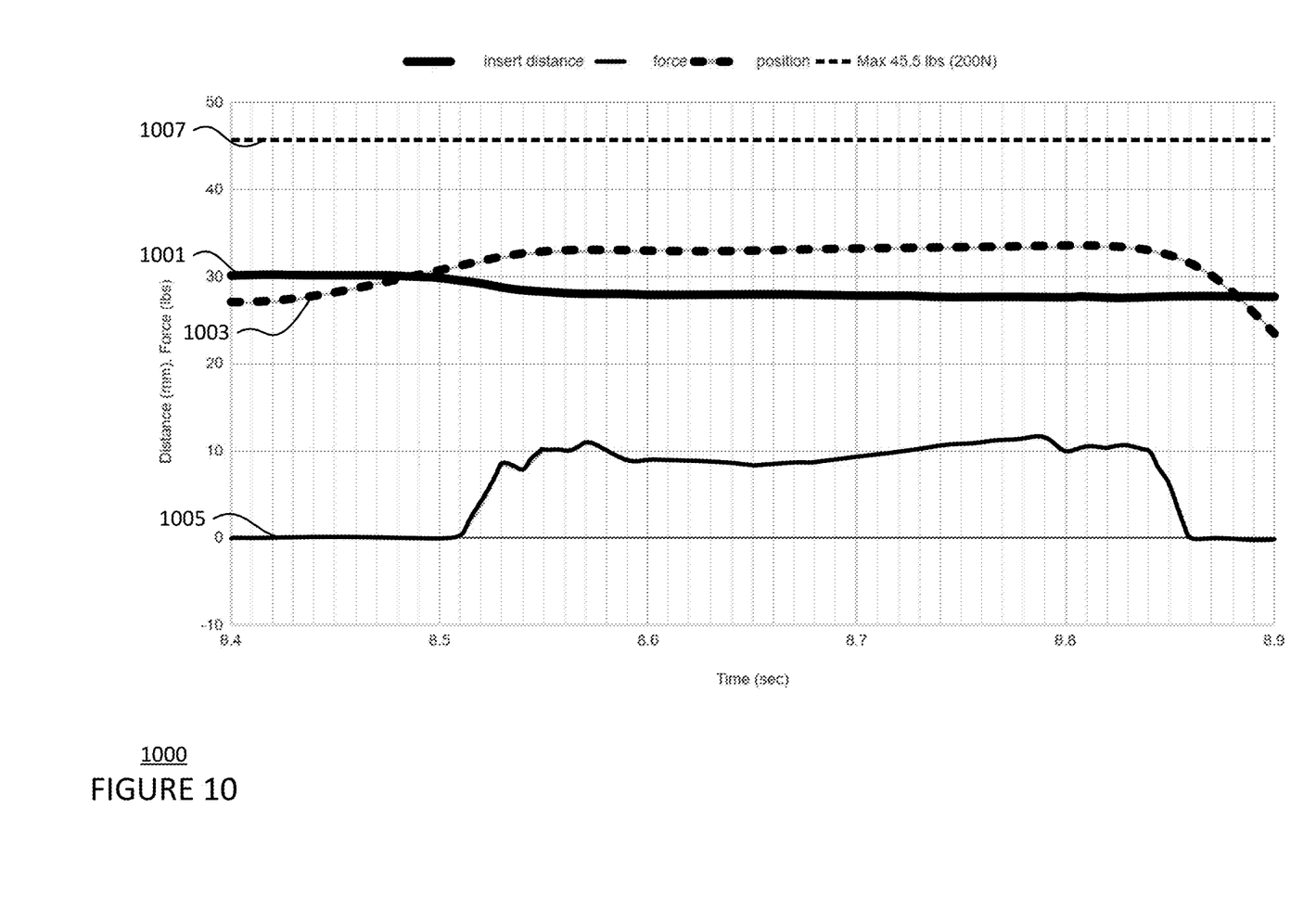
FIG. 10 is a graph showing operating parameters of the memory insertion machine in accordance with aspects of the disclosure.

At each memory socket, the memory insertion machine 100 may insert a memory module into the memory socket. For instance, at the first memory socket, the memory insertion machine 100 may begin insertion of a memory module in the first memory socket, as shown in block 905. During insertion, the insertion controller 410 may monitor operating parameters as shown in chart 1000 of FIG. 10. For instance, the insertion controller may measure the insertion distance 1001 of the memory module relative to the memory socket into which it is being inserted based on distance measurements provided by the profilometers 120a, 120b. The insertion controller 410 may control the memory insertion machine 100 and advance the insertion rods and other components of the memory insertion machine to the next memory module in the pattern once the distance of the first memory module in the first memory socket reaches a target distance 'D', as shown in block 907.

The insertion controller may also monitor the force 1003 being applied by each insertion rod 135a, 135b to a memory module. Depending on the amount of force being applied, as measured by the load cells 145a, 145b, the insertion controller may slow down or speed up the insertion speed. For instance, and as further shown in FIG. 10, the insertion controller 410 may have the insertion rods 135a, 135b move at a speed of 50 mm/sec when force 1005 is below a threshold value and 2 mm/sec when force is above a threshold value, such as 5 pound-force. As previously described, in the event the force exceeds a maximum value 1007, such as 45.5 pound-force, the insertion controller 410 may direct the drive units 111, 113, 115a, and/or 115b to cease movement of the insertion rods 135a, 135b and therefore prevent increases in forces applied to the memory module. In some instances, the insertion controller 410 may cause the drive units to retract the insertion rods away from the memory modules. The speed and positioning of each insertion rod 135a, 135b may be independently controlled to maintain the memory module in a parallel positon with the memory socket.

Although the technology herein has been described with reference to particular embodiments, it is to be understood that these embodiments are merely illustrative of the principles and applications of the present technology. It is therefore to be understood that numerous modifications may be made to the illustrative embodiments and that other arrangements may be devised without departing from the spirit and scope of the present technology as defined by the appended claims.

The invention claimed is:

1. A memory insertion machine comprising:
   a pair of insertion rods, including a first insertion rod and a second rod, wherein the first insertion rod is moveably mounted to a first vertical guide and the second insertion rod is moveably mounted to a second vertical guide;
   a horizontal guide;
   a pair of guides, wherein a first end of the horizontal guide is connected to one of the pair of guides and a second, opposite end of the horizontal guide is connected to a second of the pair of guides, wherein the first and second vertical guides are connected to the horizontal guide;
   a first motor configured to move the horizontal guide along a pair of guide tracks on the pair of guides;
   a second motor configured to move the first and second vertical guides along a guide track in the horizontal guide;
   one or more profilometers; and
   an insertion controller, wherein the insertion controller is configured to:
      position the pair of insertion rods above a memory module by controlling movement of the horizontal guide along the pair of guide tracks and movement of the first and second vertical guides along the guide track;
      (ii) apply, by controlling movement of the first insertion rod on the first vertical guide and the second insertion rod on the second vertical guide, an insertion force to a top of a memory module in a memory socket, wherein the movement of first insertion rod is managed by a third motor and the movement of the second insertion rod is managed by a fourth motor;
      (iii) determine, based on information received from the one or more profilometers, a measured distance between the top of the memory module and a top of the memory socket;
      (iv) cease applying the insertion force by the pair of insertion rods when the measured distance matches a target distance.

2. The memory insertion machine of claim 1, further comprising:
   one or more load cells, wherein the one or more load cells measure the insertion force applied to the memory module by the pair of insertion rod.

3. The memory insertion machine of claim 2, wherein the insertion force includes a first insertion force applied by the first insertion rod and a second insertion force applied by the second insertion rod, and the individual insertion forces are each measured by different load cells of the one or more load cells.

4. The memory insertion machine of claim 2, wherein the insertion controller is further configured to retract the first insertion rod and/or the second insertion rod when the first insertion force applied by the first insertion rod, the second insertion force applied by the second insertion rod, and/or the insertion force applied by the pair of insertion rods is greater than a threshold value.

5. The memory insertion machine of claim 4, wherein the threshold value is 45.5 pound-force.

6. The memory insertion machine of claim 1, wherein the insertion controller is further configured to control positions of the horizontal guide and the first and second vertical guides by controlling the first motor and the second motor, respectively.

7. The memory insertion machine of claim 1, further comprising:
   an input device configured to receive a selection of a circuit board model, wherein the circuit board model is associated with position data indicating locations of a plurality of memory sockets on a circuit board.

8. The memory insertion machine of claim 7, wherein the insertion controller is configured to position the pair of insertion rods above the plurality of memory sockets in a predefined pattern, based on the position data.

9. The memory insertion machine of claim 8, wherein for each time the pair of insertion rods are positioned above a memory socket of the plurality of memory sockets, the insertion controller causes the pair of insertion rods to apply a force to a memory module positioned in the respective memory socket until the measured distance between the top of the respective memory socket and the top of the memory module matches a target distance.

10. The memory insertion machine of claim 1, wherein the insertion controller is further configured to control an insertion speed of the memory module by controlling the insertion force applied by the pair of insertion rods.

11. The memory insertion machine of claim 10, wherein the insertion speed is adjusted based on the insertion force applied by the pair of insertion rods.

12. The memory insertion machine of claim 1, wherein the pair of insertion rods are positioned to push the memory module into the memory socket from opposite sides.

13. A method for inserting one or more memory modules into one or more memory sockets comprising:
  positioning, by an insertion controller, a pair of insertion rods including a first insertion rod and a second rod connected to a first vertical guide and a second vertical guides, respectively, above a memory module, wherein positioning the pair of insertion rods comprises:
    moving, by a first motor controlled by the insertion controller, a horizontal guide connected to a pair of guides, wherein a first end of the horizontal guide is connected to a first of the pair of guides and a second, opposite end of the horizontal guide is connected to a second of the pair of guides, wherein the first and second vertical guides are connected to the horizontal guide;
  applying, by the pair of insertion rods, an insertion force to a top of the memory module in a memory socket, wherein the insertion force is applied by a second motor moving the first insertion rod on the first vertical guide and a third moor moving the second insertion rod on the second vertical guide;
  measuring, by one or more profilometers, a distance between the top of the memory module and a top of the memory socket; and
  controlling, by an insertion controller, the insertion force applied to the memory module by the pair of insertion rods based on the measured distance, the insertion controller configured to cease applying the insertion force by the pair of insertion rods when the measured distance matches a target distance.

14. The method of claim 13, further comprising:
  measuring, by one or more load cells, the insertion force applied to the memory module by the pair of insertion rods.

15. The method of claim 14, wherein the insertion force includes a first insertion force applied by the first insertion rod and a second insertion force applied by the second insertion rod, and the first insertion force and second insertion force are each measured by by a respective one of the one or more load cells.

16. The method of claim 14, further comprising:
  retracting, by the insertion controller, the pair of insertion rods when the insertion force applied by the pair of insertion rods is greater than a threshold value.

17. The method of claim 14, further comprising:
  retracting, by the insertion controller, the first insertion rod and/or the second insertion rod when the first insertion force applied by the first insertion rod, the second insertion force applied by the second insertion rod, and/or the insertion force applied by the pair of insertion rods is greater than a threshold value.

* * * * *